(12) United States Patent  
Edwards et al.

(10) Patent No.: US 7,910,918 B2
(45) Date of Patent: Mar. 22, 2011

(54) GATED RESONANT TUNNELING DIODE

(75) Inventors: Henry L. Edwards, Garland, TX (US); Robert C. Bowen, Mount Laurel, NJ (US); Tathagata Chatterjee, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 12/542,464

(22) Filed: Aug. 17, 2009

(65) Prior Publication Data

US 2010/0065823 A1    Mar. 18, 2010

Related U.S. Application Data

(63) Continuation-in-part of application No. 12/204,604, filed on Sep. 4, 2008, now Pat. No. 7,683,364.

(60) Provisional application No. 60/969,772, filed on Sep. 4, 2007.

(51) Int. Cl.
*H01L 29/06* (2006.01)

(52) U.S. Cl. .......................................... 257/25

(58) Field of Classification Search .................. 257/25
See application file for complete search history.

(56) References Cited

U.S. PATENT DOCUMENTS

| | | | |
|---|---|---|---|
| 5,093,699 A * | 3/1992 | Weichold et al. ............. | 257/192 |
| 7,436,029 B2 | 10/2008 | Doris et al. | |
| 2006/0270169 A1 | 11/2006 | Rao | |
| 2007/0138565 A1 | 6/2007 | Datta et al. | |
| 2007/0272916 A1 | 11/2007 | Wang et al. | |
| 2007/0290265 A1 | 12/2007 | Augusto et al. | |
| 2008/0258134 A1 | 10/2008 | Mears et al. | |

FOREIGN PATENT DOCUMENTS

WO    WO2007002043    1/2007

OTHER PUBLICATIONS

"Junction Capacitance Reduction Due to Self-Aligned Pocket Implantation in Elevated Source/Drain NMOSFETs," IEEE Transactions on Electron Devices, vol. 48, No. 9, Sep. 2001, pp. 1969-1974 (Naruhisa Miura, Yuji Abe, Kohei Sugihara, Toshiyuki Oishi, Taisuke Furukawa, Takumi Nakahata, Katsuomi Shiozawa, Shigemitsu Maruno, and Yasunori Tokuda).

"Single and Multiband Modeling of Quantum Electron Transport Through Layered Semiconductor Devices," J. Appl. Phys., vol. 81, No. 12, Jun. 15, 1997, pp. 7845-7869 (Roger Lake,a) Gerhard Klimeck, R. Chris Bowen, and Dejan Jovanovic).

* cited by examiner

*Primary Examiner* — Evan Pert
(74) *Attorney, Agent, or Firm* — John J. Patti; Wade J. Brady, III; Frederick J. Telecky, Jr.

(57) ABSTRACT

A gated resonant tunneling diode (GRTD) that operates without cryogenic cooling is provided. This GRTD employs conventional CMOS process technology, preferably at the 65 nm node and smaller, which is different from other conventional quantum transistors that require other, completely different process technologies and operating conditions. To accomplish this, the GRTD uses a body of a first conduction type with a first electrode region and a second electrode region (each of a second conduction type) formed in the body. A channel is located between the first and second electrode regions in the body. A barrier region of the first conduction type is formed in the channel (with the doping level of the barrier region being greater than the doping level of the body), and a quantum well region of the second conduction type formed in the channel. Additionally, the barrier region is located between each of the first and second electrode regions and the quantum well region. An insulating layer is formed on the body with the insulating layer extending over the quantum well region and at least a portion of the barrier region, and a control electrode region is formed on the insulating layer.

24 Claims, 9 Drawing Sheets

GATED RESONANT TUNNELING DIODE

CROSS-REFERENCE TO RELATED APPLICATIONS

This application is a continuation-in-part of U.S. patent application Ser. No. 12/204,604, entitled "GATED QUANTUM RESONANT TUNNELING DIODE USING CMOS TRANSISTOR WITH MODIFIED POCKET AND LDD IMPLANTS," filed on Sep. 4, 2008, now U.S. Pat. No. 7,683,364 which is a nonprovisional application of U.S. Provisional Application No. 60/969,772, filed Sep. 4, 2007, the entireties which are hereby incorporated by reference for all purposes.

TECHNICAL FIELD

The invention relates generally to quantum mechanical transistor and, more particularly, to a gated resonant tunneling diode (GRTD).

BACKGROUND

Resonant tunneling diodes (RTDs) have been used for many years and have been extensively studied. Additionally, quantum mechanical transistors have been the focus of study for many years as well. However, each falls short of providing a next-generation, manufacturable transistor. RTDs can be manufactured with conventional CMOS technology, but do not have the desired properties of a transistor, and known quantum mechanical transistors usually require special (and prohibitively expensive) manufacturing and/or operate under cryogenic conditions (i.e., require liquid nitrogen cooling). Some examples of conventional devices are: Miura et al., "Junction Capacitance Reduction Due to Self-Aligned Pocket Implantation in Elevated Source/Drain NMOSFETs," *IEEE Transactions on Electron Devices*, Vol. 48, No. 9, September 2001; Lake et al., "Single and Multiband Modeling of Quantum Electron Transport Through Layered Semiconductor Devices," *J. Appl. Phys.*, Vol. 81, No. 12, Jun. 15, 1997; U.S. Pat. No. 7,436,029; U.S. Patent Pre-Grant Publ. No. 2006/0270169; U.S. Patent Pre-Grant Publ. No. 2007/0138565; U.S. Patent Pre-Grant Publ. No. 2007/0272916; U.S. Patent Pre-Grant Publ. No. 2007/0290265; U.S. Patent Pre-Grant Publ. No. 2008/0258134; and PCT Publ. No. WO2007002043.

SUMMARY

A preferred embodiment of the present invention, accordingly, provides an apparatus. The apparatus comprises a body of a first conduction type; a first electrode region of a second conduction type formed in the body; a second electrode region of the second conduction type formed in the body; a channel that is located between the first and second electrode regions in the body; a barrier region of the first conduction type formed in the channel, wherein the doping level of the barrier region is greater than the doping level of the body; a quantum well region of the second conduction type formed in the channel, wherein the barrier region is located between each of the first and second electrode regions and the quantum well region; an insulating layer formed on the body, wherein the insulating layer extends over the quantum well region and at least a portion of the barrier region; and a control electrode region formed on the insulating layer.

In accordance with a preferred embodiment of the present invention, the first conduction type is a P-type material, and wherein the second conduction type is an N-type material.

In accordance with a preferred embodiment of the present invention, the first conduction type is an N-type material, and wherein the second conduction type is a P-type material.

In accordance with a preferred embodiment of the present invention, the barrier region further comprises a first barrier region located between the first electrode region and the quantum well region; and a second barrier region located between the second electrode region and the quantum well region.

In accordance with a preferred embodiment of the present invention, the barrier region further comprises a generally ring-shaped region with the quantum well region located within the inner annulus of the barrier region.

In accordance with a preferred embodiment of the present invention, the body and the barrier region are formed of silicon doped with boron, wherein the concentration of boron for the body is about $3.0*10^{17}/cm^3$ to about $1.0*10^{18}/cm^3$, and wherein the concentration of boron for the barrier region is about $3.0*10^{18}/cm^3$ to about $1.0*10^{20}/cm^3$.

In accordance with a preferred embodiment of the present invention, the quantum well region is less than about 20 nm wide or less than about 20 nm in diameter.

In accordance with a preferred embodiment of the present invention, the quantum well region is about 0.5 eV.

In accordance with a preferred embodiment of the present invention, a substrate for a gated resonant tunneling diode (GRTD) is provided. The substrate comprises a channel of a first conduction type; a first electrode region of a second conduction type; a second electrode region of the second conduction type, wherein the channel is located between the first and second electrode regions; a quantum well region of the second conduction type located in the channel; and a barrier region of the first conduction type located in the channel between each of the first and second electrode regions and the quantum well region, wherein the doping level of the barrier region is greater than the doping level of the channel.

In accordance with a preferred embodiment of the present invention, a GRTD is provided. The GRTD comprises a P-type body; a P-type channel; an N-type drain region that is adjacent to the channel such that a PN junction is located at the boundary of the drain region and the body; an N-type source region that is adjacent to the channel such that a PN junction is located at the boundary of the source region and the body; an N-type quantum well located in the channel; a P-type barrier region located within the channel between each of the drain and source regions and the quantum well, and wherein the level of doping of the barrier region is greater than the level of doping for the channel; a gate oxide layer that extends over at least a portion of the channel; and a gate that extends over at least a portion of the gate oxide layer.

In accordance with a preferred embodiment of the present invention, a GRTD is provided. The GRTD comprises an N-type body; an N-type channel; a P-type drain region that is adjacent to the channel such that a PN junction is located at the boundary of the drain region and the body; a P-type source region that is adjacent to the channel such that a PN junction is located at the boundary of the source region and the body; a P-type quantum well located in the channel; an N-type barrier region located within the channel between each of the drain and source regions and the quantum well, and wherein the level of doping of the barrier region is greater than the level of doping for the channel; a gate oxide layer that extends over at least a portion of the channel; and a gate that extends over at least a portion of the gate oxide layer.

In accordance with a preferred embodiment of the present invention, a method for forming a GRTD is provided. The method comprises forming a body of a first conduction type;

forming a first electrode region and a second electrode region in the body, wherein each of the first and second electrode regions are of a second conduction type, and wherein the first and second electrode regions are spatially separated from one another such that there is a channel region between the first and second electrode regions; forming a barrier region of the first conduction type in the channel region, wherein the level of doping of the barrier region is greater than the level of doping of the body; forming a quantum well region of the second conduction type in the channel region such that the barrier region is located between each of the first and second electrode regions and the quantum well region; forming an insulating layer over at least a portion of the channel region; and forming a gate electrode over at least a portion of the insulating layer.

In accordance with a preferred embodiment of the present invention, the step of forming the body further comprises: implanting an N-type material into a P-type substrate to form a deep N-well; and implanting a P-type material into the P-type substrate in a region above the deep N-well to form the body, wherein the level of doping of the body is greater than the level of doping of the P-type substrate.

In accordance with a preferred embodiment of the present invention, the step of forming the first and second electrode regions further comprises implanting the N-type material into the body to form the first and second electrode regions.

In accordance with a preferred embodiment of the present invention, the step of forming the barrier region further comprises implanting the P-type material into the channel region to form the barrier region.

In accordance with a preferred embodiment of the present invention, the step of forming the body further comprise implanting an N-type material into a P-type substrate to form the body.

In accordance with a preferred embodiment of the present invention, the step of forming the barrier region further comprises: forming a first barrier region that is located between the first electrode region and the quantum well region; and forming a second barrier region that is located between the second electrode region and the quantum well region.

In accordance with a preferred embodiment of the present invention, the steps of forming the barrier region and forming the quantum well region further comprise forming a generally ring-shaped barrier region with the quantum well region located within the inner annulus of the barrier region.

In accordance with a preferred embodiment of the present invention, a method for forming a GRTD is provided. The method comprises forming a P-type body; forming an N-type first electrode region and an N-type second electrode region in the body, and wherein the first and second electrode regions are spatially separated from one another such that there is a channel region between the first and second electrode regions; forming a P-type barrier region in the channel region, wherein the level of doping of the barrier region is greater than the level of doping of the body; and forming an N-type quantum well region in the channel region such that the barrier region is located between each of the first and second electrode regions and the quantum well region.

In accordance with a preferred embodiment of the present invention, the method further comprises: forming an insulating layer over at least a portion of the channel region; and forming a gate electrode over at least a portion of the insulating layer.

In accordance with a preferred embodiment of the present invention, phosphorous is used as the N-type dopant.

In accordance with a preferred embodiment of the present invention, boron is used as the P-type dopant.

In accordance with a preferred embodiment of the present invention, a method for forming a GRTD is provided. The method comprises forming an N-type body; forming a P-type first electrode region and a P-type second electrode region in the body, and wherein the first and second electrode regions are spatially separated from one another such that there is a channel region between the first and second electrode regions; forming an N-type barrier region in the channel region, wherein the level of doping of the barrier region is greater than the level of doping of the body; and forming a P-type quantum well region in the channel region such that the barrier region is located between each of the first and second electrode regions and the quantum well region.

In accordance with a preferred embodiment of the present invention, the method further comprises: forming an insulating layer over at least a portion of the channel region; and forming a gate electrode over at least a portion of the insulating layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 1A:
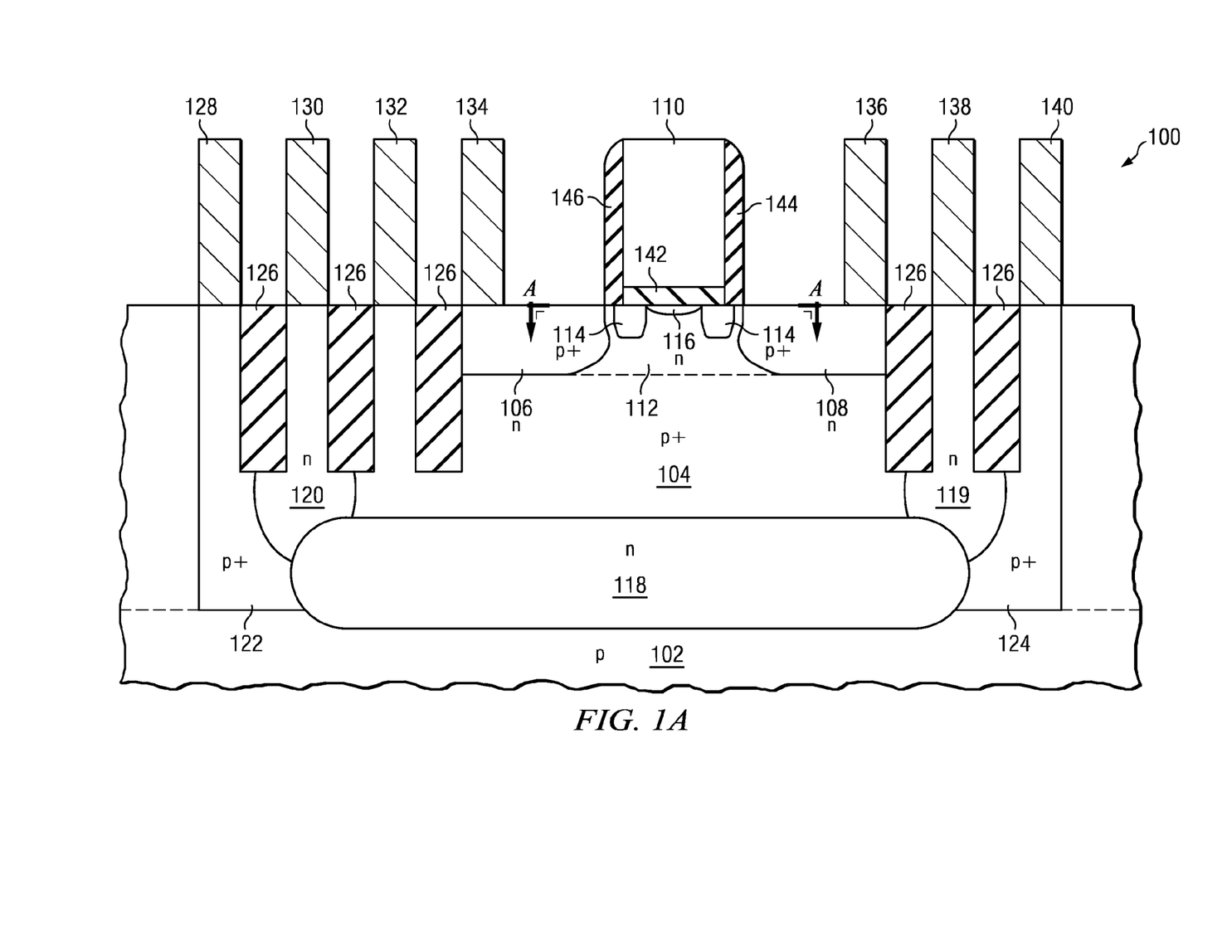
FIG. 1A is a cross-sectional elevation view of an example of an NMOS gated resonant tunneling diode (GRTD) in accordance with a preferred embodiment of the present invention.
Figure 1B:
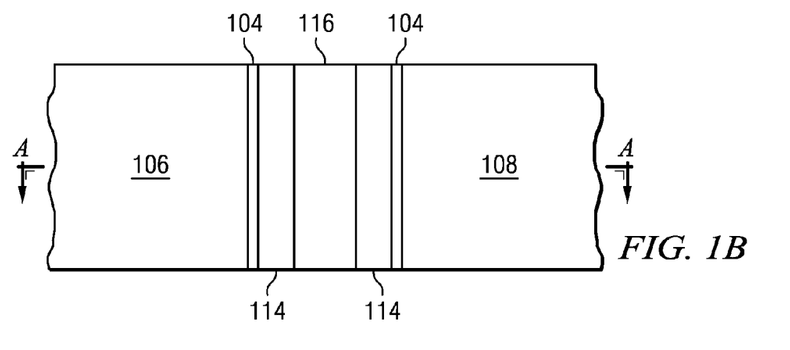
FIGS. 1B and 1C are examples of cross-sectional plan views of the NMOS GRTD of FIG. 1A along line A-A.
Figure 1C:
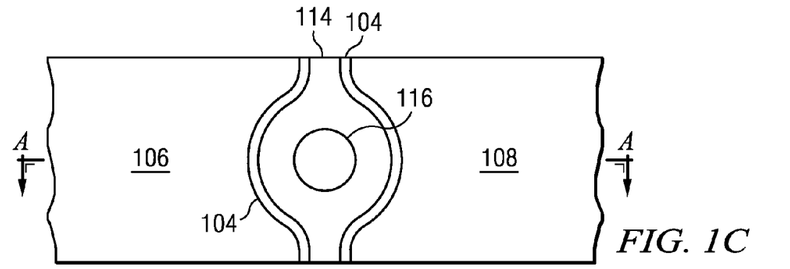

Referring to FIGS. 1A-1C of the drawings, the reference numeral 100 generally designates an NMOS gated resonant tunneling diode (GRTD) in accordance with a preferred embodiment of the present invention. GRTD 100 generally comprises a substrate 102, a body 104, an electrode region or source 106, an electrode region or drain 108, channel or channel region 112, barrier region 114, quantum well region 116, deep N-well or DNWell 118, shallow N-wells or NWells 119 and 120, shallow P-wells or PWells 122 and 124, shallow trench isolation (STI) 126, contacts 128, 130, 132, 134, 136, 138, and 140, insulating or gate oxide layer 142, control or gate electrode 110, and insulating layers 144 and 146.

Preferably, GRTD 100 is formed using conventional CMOS process technologies, as shown below in FIGS. 7A through 7I, at the 65 nm node as well as other (preferably smaller) process nodes. To form the GRTD 100, the substrate 102 is preferably formed of silicon doped with a P-type material, such as boron or indium; preferably, the level of doping of the substrate 102 is about $10^{-16}/cm^3$. Formed within the substrate 102 are PWells 122 and 124, which are also doped with P-type material with the level of doping of the PWells 122 and 124 being greater than the substrate 102 (preferably $3.0*10^{17}/cm^3$ to about $1.0*10^{18}/cm^3$). Substrate contact or PSub contacts 128 and 140 can also be formed on the PWells 122 and 124 to allow for electrical contact with and/or control of the substrate 102. Preferably, these contacts 128 and 140 can be formed of a variety of conductive materials, such as tungsten or titanium silicide.

DNWell 118 and NWells 119 and 120 are also formed within the substrate 102. Each of the NWells 119 and 120 are isolated from PWells 122 and 124 by STIs 126 and are generally contiguous with DNWell 118 (which generally isolates the active regions of the NMOS GRTD 100 from the substrate 102). Each of the DNwell 118 and NWells 119 and 120 are doped with an N-type material (such as phosphorous, antimony, or arsenic). Preferably, the DNwell 118 has a concentration of doping of about $10^{16}/cm^3$ to about $10^{17}/cm^3$, and the NWells 119 and 120 preferably have a doping level of about $10^{16}/cm^3$ to about $3*10^{17}/cm^3$. DNWell contacts 130 and 138 can also be formed on the NWells 119 and 120 to allow for electrical contact with and/or control of the DNWell 118.

Figure 2A:
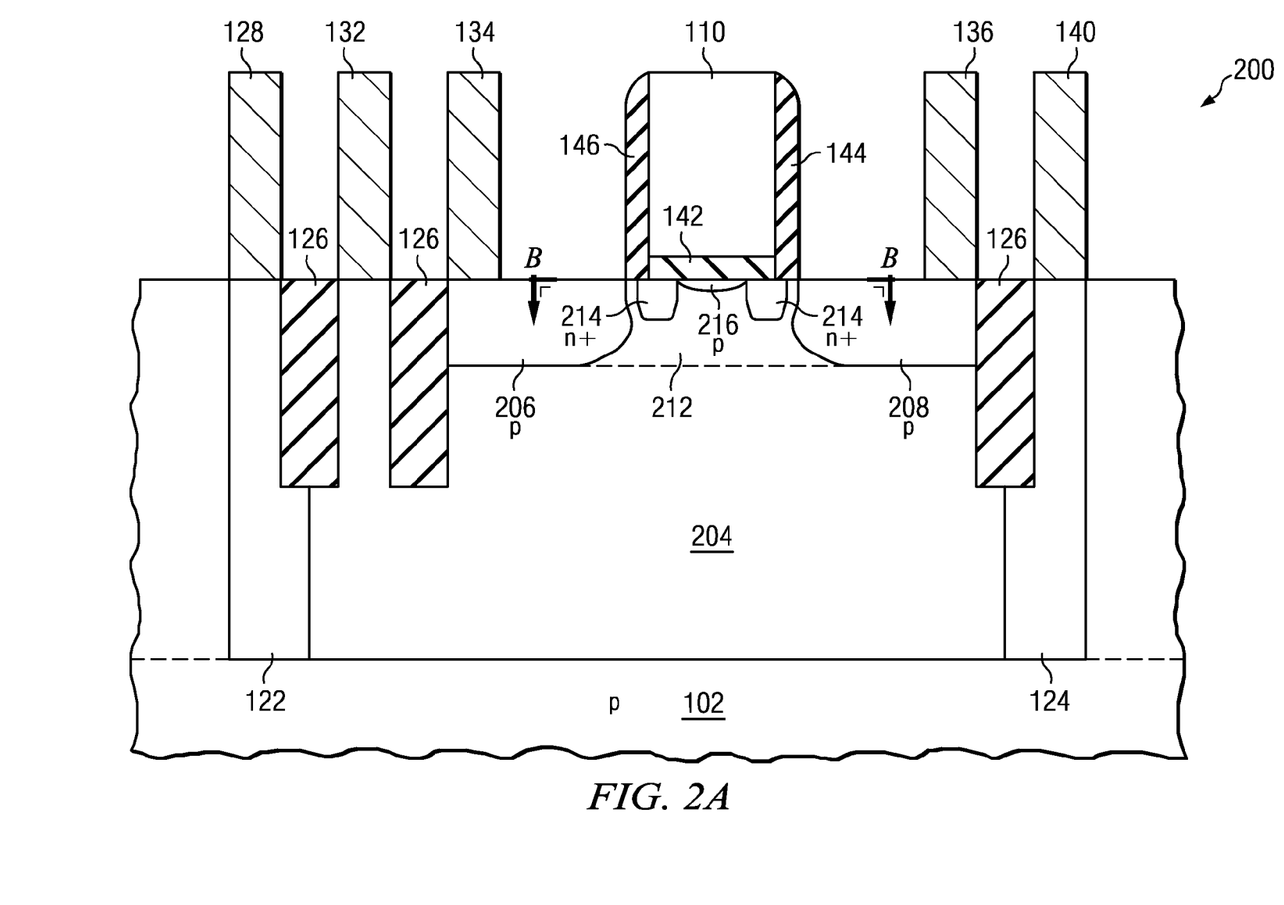
FIG. 2A is a cross-sectional elevation view of an example of a PMOS GRTD in accordance with a preferred embodiment of the present invention.
Figure 2B:
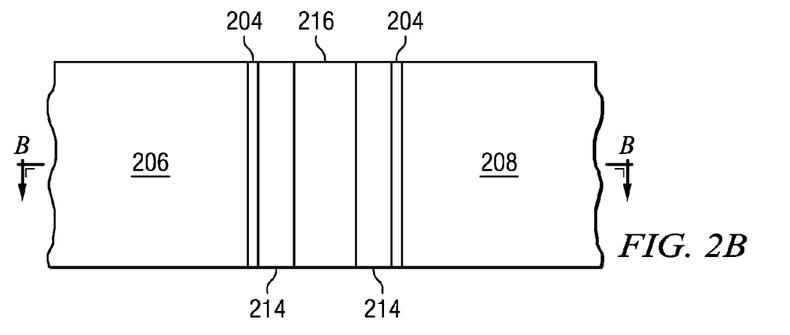
FIGS. 2B and 2C are examples of cross-sectional plan views of the PMOS GRTD of FIG. 2A along line B-B.

A body 104 can then be formed in the substrate 102 above the DNwell 118 and NWells 119 and 120. The body 104 is preferably doped with a P-type material (such as boron or indium), and each of the electrode regions 106 and 108 (which are formed in the body 104) are silicon doped with an N-type material (such as arsenic or phosphorous) at concentrations of about $10^{16}/cm^3$ to about $10^{17}/cm^3$ so that a PN junctions are formed at the boundaries between the body 104 and electrode regions 106 and 108. For the sake of simplicity, however, no depletion region(s) are depicted in FIG. 1, 2A, or 2B. Additionally, a body contact 132 (which is isolated from NWell 120 and source 106 by STIs 126) can also be formed on the substrate 102 to allow for electrical contact with and/or control of the body 104.

As can be seen in FIGS. 1A through 1C, the electrode regions 106 and 108 are typically planar regions that are spatially separated from one another with a channel region 112 located therebetween. Preferably, the channel region 112 is a P-type region with the same level of doping as the body 104. Formed within the channel region 112 is barrier region 114. Barrier region 114 is a region doped with a P-type material; however, the level of doping of the barrier region 114 is generally greater than that of the body 104 and channel region 112. Preferably, body 104 and channel region 112 have a concentration of dopant (such as boron or aluminum) of about $3.0*10^{17}/cm^3$ to about $1.0*10^{18}/cm^3$, and the barrier region 114 has a concentration of dopant of about $3.0*10^{18}/cm^3$ to about $1.0*10^{20}/cm^3$. Barrier region 114 can generally be formed as two strips (as shown in FIG. 1B) or can be formed to be generally ring-shaped (as shown in FIG. 1C).

A quantum well region 116 is also formed in channel region 112 as a lateral quantum well generally by application of a voltage to gate 110. The quantum well region 116 is generally an N-type region. As can be seen in each of FIGS. 1A through 1C, the barrier region 114 is located or formed between each of the electrode regions 106 and 108 and the quantum well region 116. In FIG. 1B, the quantum well region 116 is mainly confined in one lateral direction, operating as a quantum wire, and in FIG. 1C, the quantum well region 116 is small and confined in both lateral directions by the inner annulus of barrier region 110, operating as a quantum dot. It should also be noted that each of the regions 106, 108, 114, and 116 (as well as body 104) can be formed through ion implantation on an underlying silicon wafer or substrate 102, but each can be formed in separate layers on top of an underlying silicon wafer or substrate 102. The term "formed in" is also intended to be construed broadly to include both situations.

As can be seen in FIG. 1, an insulating or gate oxide layer 142 is generally formed over or on at least a portion of the channel region 112. The insulating layer 142 is generally grown on the substrate 102 and is preferably formed of silicon dioxide or other dielectric materials with a thickness of less than about 200 nm. Preferably, the insulating layer 142 extends over the quantum well region 112 and a portion of the barrier region 110. Formed on the insulating layer 142 is the gate electrode 110 (which is generally formed of a conductive material like polysilicon, titanium silicide, tungsten, and other conductive materials), and sidewall insulating layers 146 and 144 are also formed on each side of the gate electrode 110. Source contact 134 and drain contact 136 can also formed on the substrate of a conductive material (i.e., tungsten) to allow for electrical contract with and/or control of the source region 106 and drain region 108, respectively.

Figure 2C:
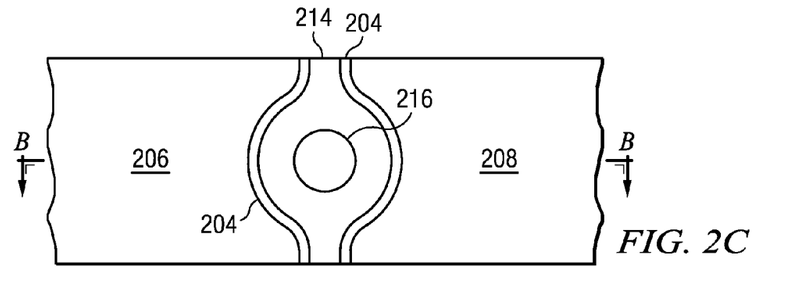

Turing to FIGS. 2A through 2C, an example of a PMOS GRTD 200 can be seen. Much of the structure, such as the contacts 128, 132, 134, 136, and 140, insulating layers 146, 144, and 142, gate electrode 110, PWells 122 and 124, and STIs 126 are similar to the NMOS GRTD 100, and, for the sake of simplicity, are not discussed with respect to PMOS GRTD 200. Additionally, the geometry of GRTD 200 as shown in FIGS. 2B and 2C is similar to geometry of GTRD 100 as shown in FIGS. 1B and 1C; accordingly, the geometry of GTRD 200 is not discussed for the sake of simplicity. Some differences, however, between GRTD 100 and GRTD 200 are the absence of DNWell 118 and NWells 119 and 120 in GRTD 200 as well as a reversal of the conduction types of the active regions. Namely, the body 204, the channel region 212, and barrier region 214 are doped with an N-type material at concentrations of about $3.0*10^{17}/cm^3$ to about $1.0*10^{18}/cm^3$, about $3.0*10^{17}/cm^3$ to about $1.0*10^{18}/cm^3$, and about $3.0*10^{18}/cm^3$, respectively. Additionally, the source region 206 and drain region 208 are doped with a P-type material at a concentration of about $10^{16}/cm^3$ to about $10^{17}/cm^3$. Quantum well region 216 is also a P-type region formed generally by application of a voltage to gate 110.

Figure 3A:
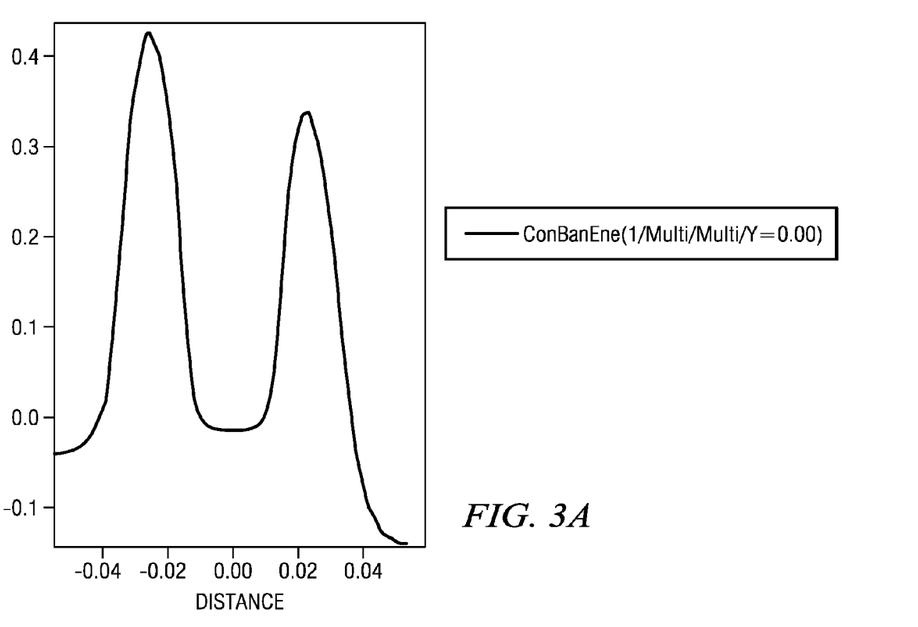
FIGS. 3A, 3B, and 4 are examples of diagrams depicting the potential well of the GRTDs of FIGS. 1 and 2.
Figure 3B:
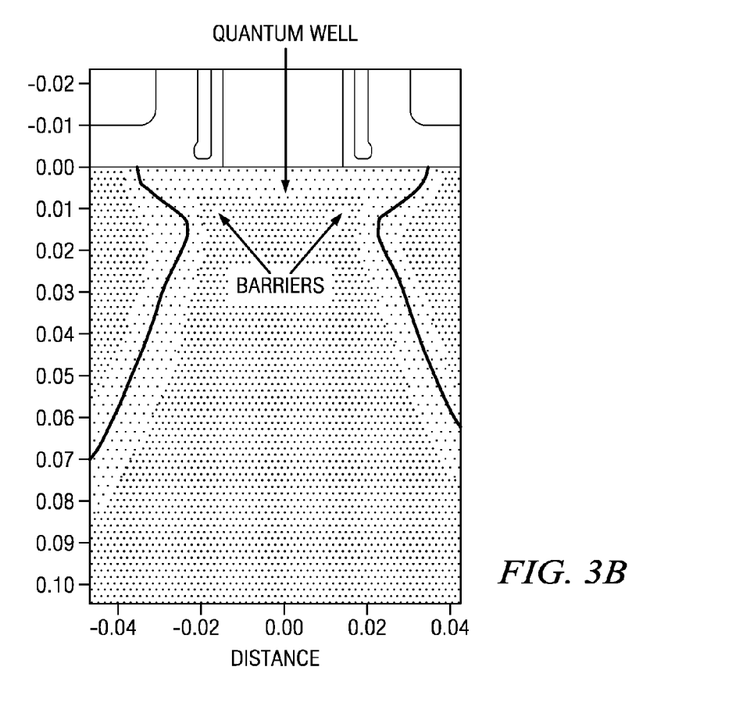
Figure 4:
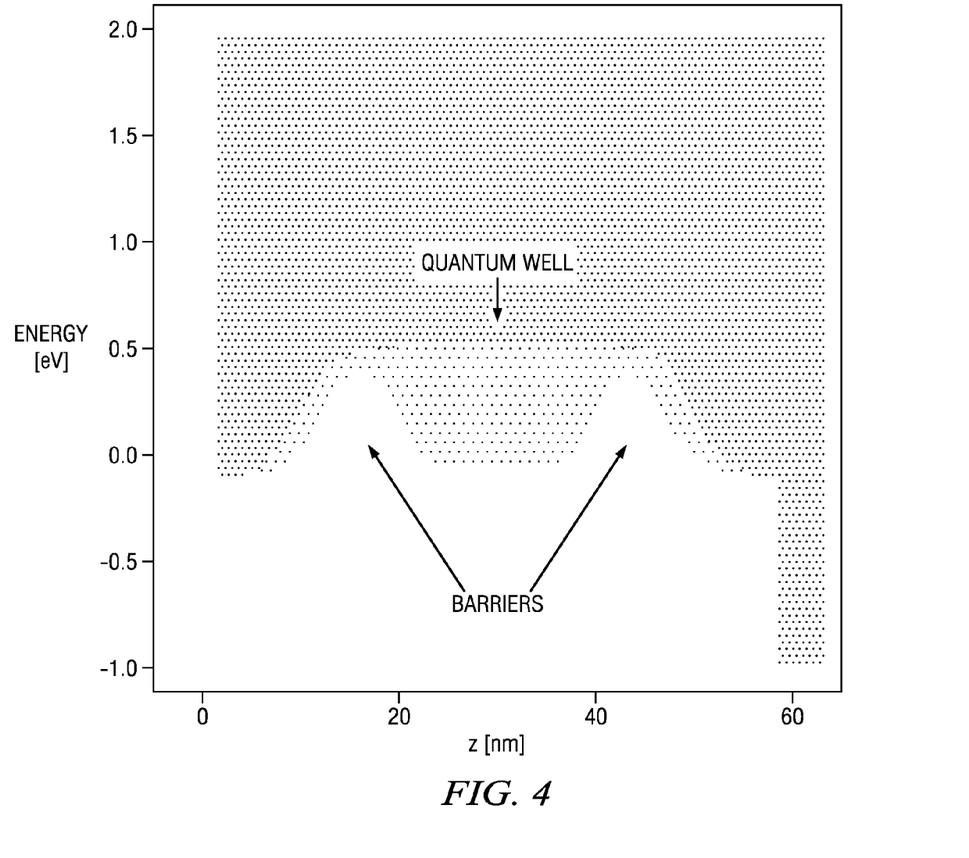

In operation, which can be seen in FIGS. 3A, 3B, and 4, a quantum well is, at least in part, created and bound by the barrier regions 214 and 114. In particular, FIGS. 3A and 3B generally depict conduction band plots, while FIG. 4 generally depicts the density of states for the quantum well regions 114 and 214. As with convention resonant tunneling diodes (RTDs), GRTDs 100 and 200 each employ two potential barriers to form the quantum well with a number of states within the well to have resonant tunneling. GRTDs 100 and 200, as shown, each have a quantum well regions 114 and 214 that is approximately 0.5 eV with a width or diameter of less than about 20 nm; however, better performance can be observed with width or diameter of less than about 10 nm. A significant difference between conventional RTDs and GRTDs 100 and 200 is that voltage and current can be applied to the gate 110 to increase or decrease the transmissivity across the channel region 112 or 212 by filling the conduction band with electrons or removing electrons. Voltage and current can also be applied to bodies 104 and 204, allow for a total of four terminals to control the GTRDs 100 and 200, as opposed to two terminals in conventional RTDs.

A reason for the operation of the GRTDs 100 and 200 is based on the quantum mechanics of the devices. The equation of motion for the for the Green function, $G^R$, of GRTDs 100 and 200 is as follows:

$$(E - H_i^D - \Sigma_L - \Sigma_R - \Sigma_G - \Sigma_{SCAT})G^R = 1, \quad (1),$$

where $H_i^D$ is the Hamiltonian for the device at band i and $\Sigma_L$, $\Sigma_R$, $\Sigma_G$, and $\Sigma_{SCAT}$ are the self-energies for the electrode region 106 or 206, the electrode region 108 or 208, gate 110, and scattering, respectively. Additionally, the Hamiltonian $H_i^D$ is $$H_i = -\frac{\hbar^2}{2}\left(\frac{\partial}{\partial x}\frac{1}{m_i^*(x)}\frac{\partial}{\partial x} + \frac{\partial}{\partial y}\frac{1}{m_i^*(y)}\frac{\partial}{\partial y} - \frac{k_i^2(z)}{m_i^*(z)}\right) + V(x,y), \quad (2)$$

where $m^*_i(x)$ is the effective mass for the x-direction, $m^*_i(y)$ is the effective mass for the y-direction, and $m^*_i(z)$ is the effective mass for the z-direction. By solving for the Green function, $G^R$, both the current density, J, can be approximately determined as follows:

$$J = \frac{2e}{\hbar A}\sum_i \int \frac{dE}{2\pi} Tr[\Gamma^{BL} G^R \Gamma^{BR} [G^R]^+](f_L - f_R), \quad (3)$$

where $f_L$ and $f_R$ are the Fermi factors for the electrode regions 104 and 106, respectively, and where $$\Gamma^{BL} = i[\Sigma_L - \Sigma_L^+] \quad (4)$$

and $$\Gamma^{BR} = i[\Sigma_R - \Sigma_R^+]. \quad (5)$$

For a more detailed analysis of modeling for conventional RTDs (which is generally analogous to GRTDs 100 and 200), see the following: Lake et al., "Single and Multiband Modeling of Quantum Electron Transport Through Layered Semiconductor Devices," *J. Appl. Phys.*, Vol. 81, No. 12, Jun. 15, 1997.

Figure 5A:
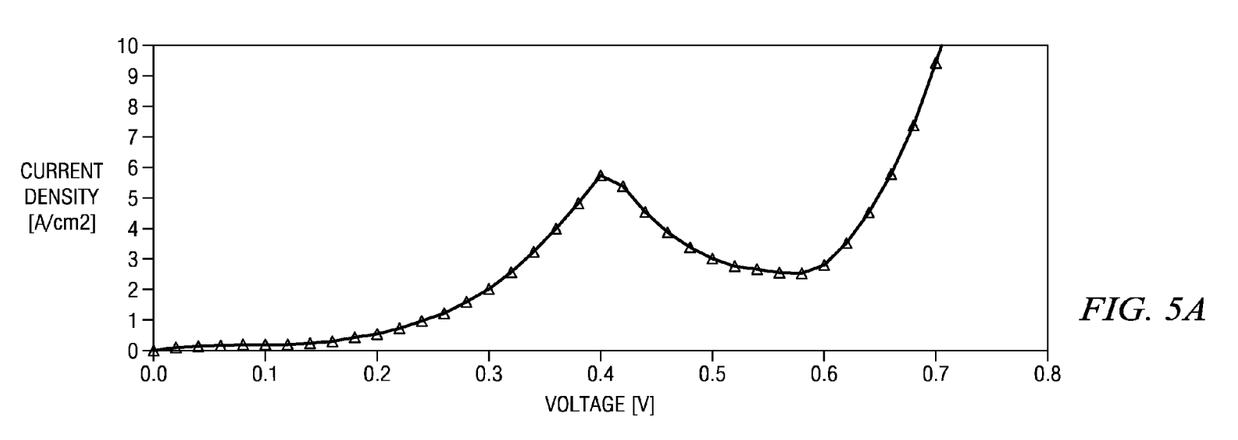
FIGS. 5A and 5B are graphs depicting examples of current density versus voltage for the drain region of the GRTD of FIG. 1.
Figure 5B:
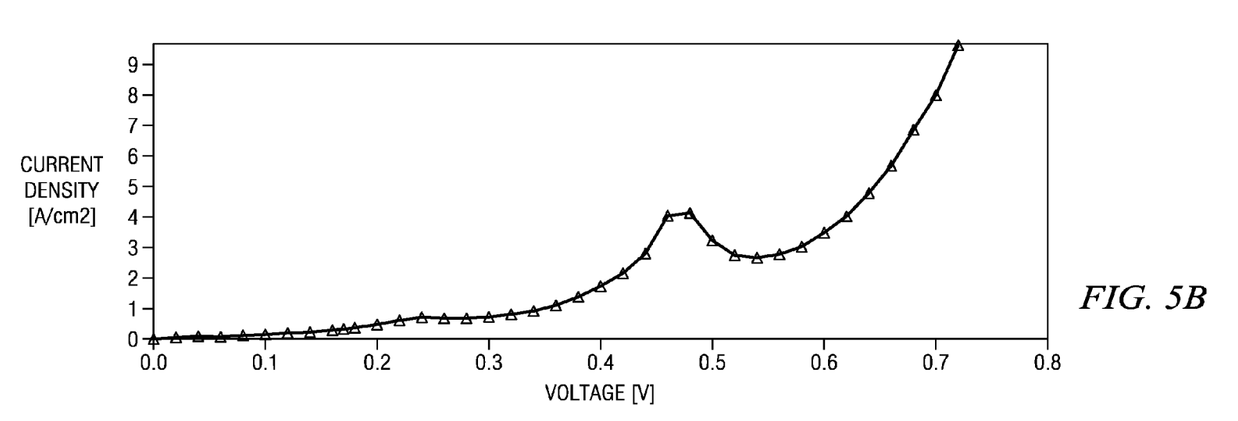

Now turning to FIGS. 5A and 5B, graphs depicting examples of the current density (derived from equation (3) above) versus voltage for the electrode region 108 (essentially operating without cryogenic cooling) can be seen. For FIG. 5A, the current density versus voltage for a 10 nm quantum well region 116 is shown, and for FIG. 5B, the current density versus voltage for a 20 nm quantum well region shown.

Figure 6:
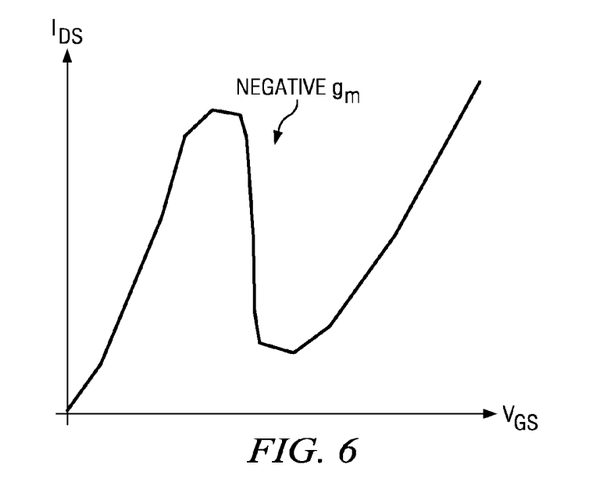
FIG. 6 is an example of a drain-source current ($I_{DS}$) versus gate-source voltage ($V_{GS}$) diagram for the GRTD of FIG. 1.

Clearly, the introduction of a gate 110 and body 104 is a significant development over convention RTDs in that GRTD 100 has a $g_m$ or gain. Turning FIG. 6, a graph depicting an example of the drain-source current ($I_{DS}$) versus gate-source voltage ($V_{GS}$) is shown. This graph shows that GRTD 100 possesses a negative $g_m$, which is desirable for many applications.

Now turning to FIGS. 7A through 7G, an example of a process for forming an NMOS GRTD 100 is shown. For the sake of simplicity, however, features of GRTD 100 (such as the formation of a region that is adjacent to a body contact 132) have been omitted. Many conventional CMOS process steps, such as annealing and thermal activation, have also been omitted for the sake of simplicity. Additionally, ion implantation is shown in FIGS. 7A through 7I, but film growth techniques may be used in place of or in addition to the ion implantation techniques shown.

Figure 7A:
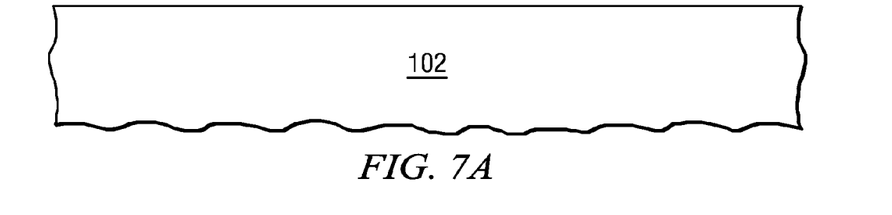
FIG. 7A through 7G are cross-sectional elevation views of the substrate depicting an example of a process for constructing the NMOS GRTD of FIG. 1.
Figure 7B:
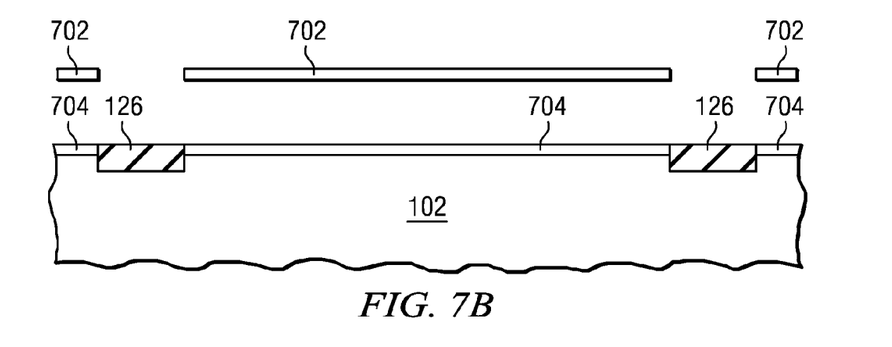

A process for forming the NMOS GRTD 100 generally begins with a P-type substrate 102 as shown in FIG. 7A. STIs 126 can be formed in substrate 102 using a conventional CMOS STI loop. As can be seen in FIG. 7B, mask 702 enables formation of STIs 126. Additionally, as part of the STI loop a polish stop nitride layer 704 (typically silicon nitride) is provided.

Figure 7C:
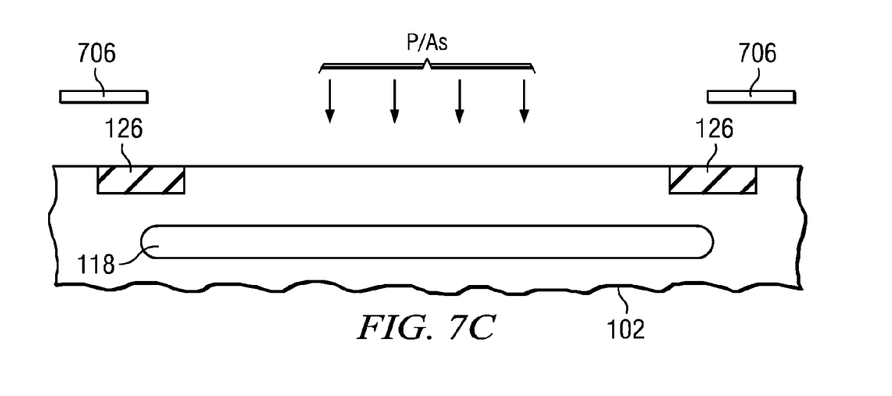
Figure 7D:
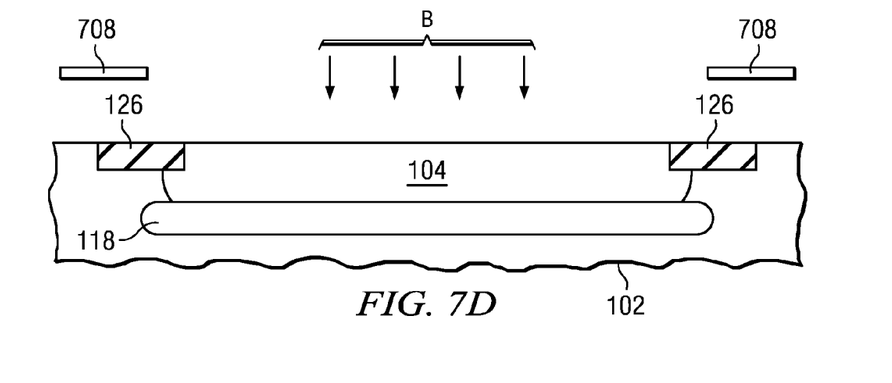

Following the formation of STIs 126, the body 104 can be formed. Turning to FIG. 7C, mask 706 is used to form the DNWell 118. Preferably, an N-type material, such as phosphorous or arsenic, is implanted into substrate 102. The body 104 is then formed in the region above the DNWell 118, as shown in FIG. 7D, by implantation of a P-type material (such as boron) using mask 708.

Figure 7E:
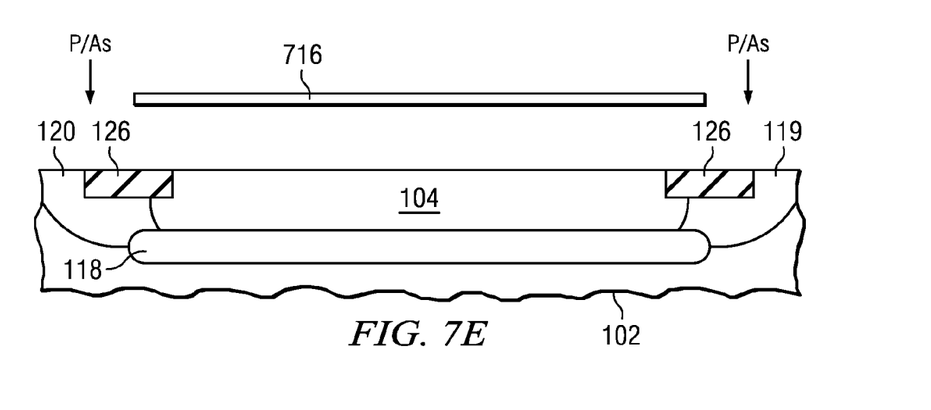
Figure 7F:
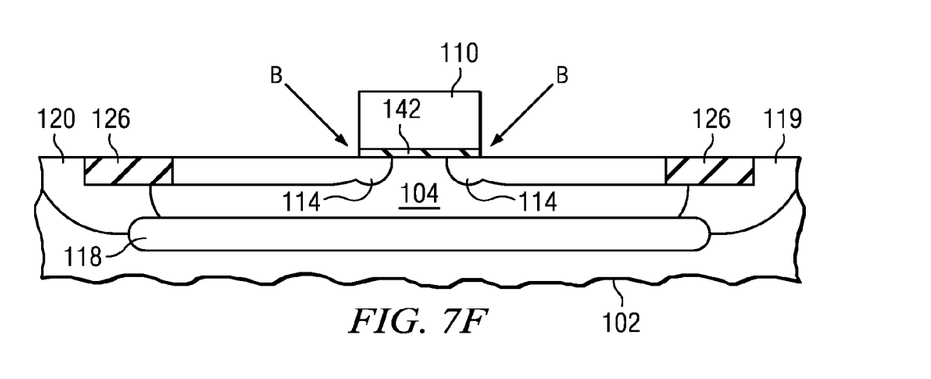
Figure 7G:
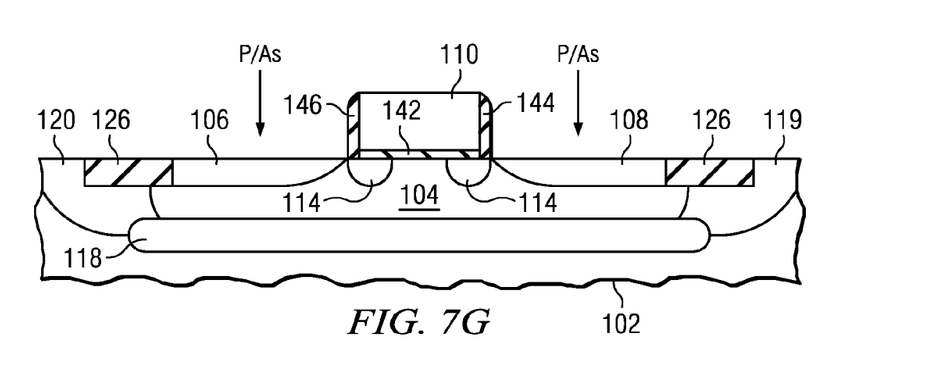

As shown in FIGS. 7F and 7G, the electrode regions 106 and 108 and barrier region 114 are formed through a self-aligning technique. Turning first to FIG. 7E, the insulating layer 142 and gate electrode 110 are formed over at least a portion of the channel (not shown) and a P-type material (boron for example and as shown) are implanted into the barrier region. Additionally, the angle of the arrows indicating the path of the ions is for illustrative purposes and is not necessarily accurate. Once the barrier region 114 is formed, insulating sidewalls or layers 142 and 144 are formed, and a N-type material (such as phosphorous or arsenic) is implanted to form the electrode regions 106 and 108 (as can be seen in FIG. 7F).

Prior to the formation of the electrode regions 106 and 108 and the barrier region 114, mask 716 is used to form the NWells 118 and 120 by implanting an N-type material, as shown in FIG. 7E.

Figure 8A:
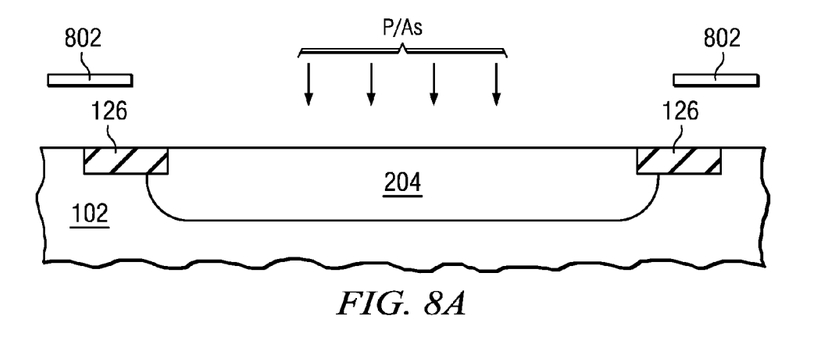
FIG. 8A through 8C are cross-sectional elevation views of the substrate depicting an example of a process for constructing the PMOS GRTD of FIG. 2.
Figure 8B:
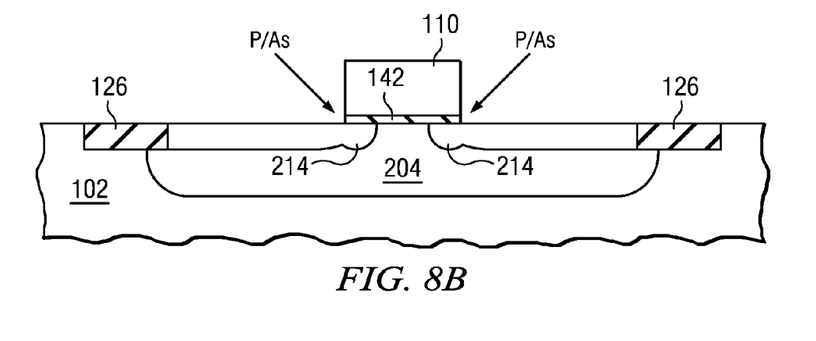
Figure 8C:
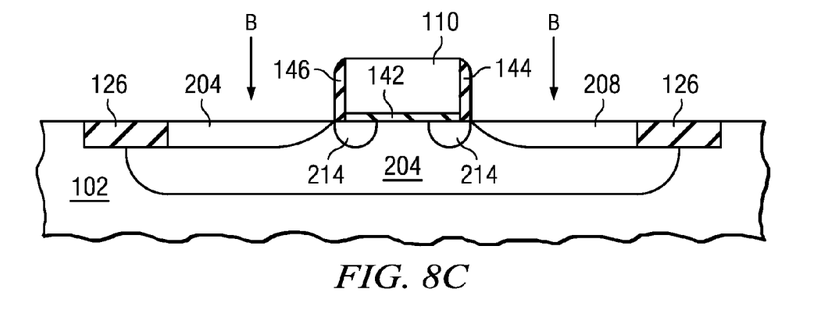

Turning to FIGS. 8A through 8C, an example of a process for forming PMOS GRTD 200 is shown. The example process for forming GRTD 200 in FIGS. 8A through 8C is similar to the example process for forming GRTD 100 in FIGS. 7A through 7G. In particular, the process steps of FIGS. 8A through 8C (which uses mask 802 in FIG. 8A) are analogous to the process steps of FIGS. 7D through 7F, respectively. Some differences are that the steps of forming DNWell 118 and NWells 119 and 120 are omitted. Additionally, the conduction types used for the active regions in FIGS. 8A through 8C are reversed compared to the respective process steps of FIGS. 7D through 7F.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a body of a first conduction type;
   a first electrode region of a second conduction type formed in the body;
   a second electrode region of the second conduction type formed in the body;
   a channel that is located between the first and second electrode regions in the body;
   a barrier region of the first conduction type formed in the channel, wherein the doping level of the barrier region is greater than the doping level of the body;
   a quantum well region of the second conduction type formed in the channel, wherein the barrier region is located between each of the first and second electrode regions and the quantum well region;
   an insulating layer formed on the body, wherein the insulating layer extends over the quantum well region and at least a portion of the barrier region; and
   a control electrode region formed on the insulating layer.

2. The apparatus of claim 1, wherein the first conduction type is a P-type material, and wherein the second conduction type is an N-type material.

3. The apparatus of claim 1, wherein the first conduction type is an N-type material, and wherein the second conduction type is a P-type material.

4. The apparatus of claim 1, wherein the barrier region further comprises:
   a first barrier region located between the first electrode region and the quantum well region; and
   a second barrier region located between the second electrode region and the quantum well region.

5. The apparatus of claim 1, wherein the barrier region further comprises a generally ring-shaped region with the quantum well region located within the inner annulus of the barrier region.

6. The apparatus of claim 1, wherein the body and the barrier region are formed of silicon doped with boron, wherein the concentration of boron for the body is about $3.0*10^{17}/cm^3$ to about $1.0*10^{18}/cm^3$, and wherein the concentration of boron for the barrier region is about $3.0*10^{18}/cm^3$ to about $1.0*10^{20}/cm^3$.

7. The apparatus of claim 1, wherein the quantum well region is less than about 20 nm wide or less than about 20 nm in diameter.

8. The apparatus of claim 7, wherein the quantum well region is about 0.5 eV.

9. A substrate for a gated resonant tunneling diode (GRTD), the substrate comprising:
   a channel of a first conduction type;
   a first electrode region of a second conduction type;
   a second electrode region of the second conduction type, wherein the channel is located between the first and second electrode regions;
   a quantum well region of the second conduction type located in the channel; and
   a barrier region of the first conduction type located in the channel between each of the first and second electrode regions and the quantum well region, wherein the doping level of the barrier region is greater than the doping level of the channel.

10. The substrate of claim 9, wherein the first conduction type is a P-type material, and wherein the second conduction type is an N-type material.

11. The substrate of claim 9, wherein the first conduction type is an N-type material, and wherein the second conduction type is a P-type material.

12. The substrate of claim 9, wherein the barrier region further comprises:
   a first barrier region located between the first electrode region and the quantum well region; and
   a second barrier region located between the second electrode region and the quantum well region.

13. The substrate of claim 9, wherein the barrier region further comprises a generally ring-shaped region with the quantum well region is located within the inner annulus of the barrier region.

14. The substrate of claim 9, wherein the underlying portion and the barrier region are formed of silicon doped with boron, wherein the concentration of boron for the channel is about $3.0*10^{17}/cm^3$ to about $1.0*10^{18}/cm^3$, and wherein the concentration of boron for the barrier region is about $3.0*10^{18}/cm^3$ to about $1.0*10^{20}/cm^3$.

15. The substrate of claim 9, wherein the quantum well region is less than about 20 nm wide or less than about 20 nm in diameter.

16. The substrate of claim 15, wherein the quantum well region is about 0.5 eV.

17. A GRTD comprising:
   a P-type body;
   a P-type channel;
   an N-type drain region that is adjacent to the channel such that a PN junction is located at the boundary of the drain region and the body;
   an N-type source region that is adjacent to the channel such that a PN junction is located at the boundary of the source region and the body;
   an N-type quantum well located in the channel;
   a P-type barrier region located within the channel between each of the drain and source regions and the quantum well, and wherein the level of doping of the barrier region is greater than the level of doping for the channel;
   a gate oxide layer that extends over at least a portion of the channel; and
   a gate that extends over at least a portion of the gate oxide layer.

18. The GRTD of claim 17, wherein the barrier region further comprises:
   a first barrier region located between the first electrode region and the quantum well region; and
   a second barrier region located between the second electrode region and the quantum well region.

19. The GRTD of claim 17, wherein the barrier region further comprises a generally ring-shaped region with the quantum well located within the inner annulus of the barrier region.

20. The GRTD of claim 17, wherein the quantum well is less than about 20 nm wide or less than about 20 nm in diameter.

21. A GRTD comprising:
   An N-type body;
   an N-type channel;
   a P-type drain region that is adjacent to the channel such that a PN junction is located at the boundary of the drain region and the body;
   a P-type source region that is adjacent to the channel such that a PN junction is located at the boundary of the source region and the body;
   a P-type quantum well located in the channel;
   an N-type barrier region located within the channel between each of the drain and source regions and the quantum well, and wherein the level of doping of the barrier region is greater than the level of doping for the channel;

a gate oxide layer that extends over at least a portion of the channel; and a gate that extends over at least a portion of the gate oxide layer.

22. The GRTD of claim 21, wherein the barrier region further comprises:

a first barrier region located between the first electrode region and the quantum well; and a second barrier region located between the second electrode region and the quantum well.

23. The GRTD of claim 21, wherein the barrier region further comprises a generally ring-shaped region with the quantum well located within the inner annulus of the barrier region.

24. The GRTD of claim 21, wherein the quantum well is less than about 20 nm wide or less than about 20 nm in diameter.

* * * * *